(12) United States Patent
Tanisaka

(10) Patent No.: US 10,122,147 B2
(45) Date of Patent: Nov. 6, 2018

(54) METHOD FOR MANUFACTURING OPTICAL MEMBER AND METHOD FOR MANUFACTURING SEMICONDUCTOR LASER DEVICE

(71) Applicant: NICHIA CORPORATION, Anan-shi, Tokushima (JP)

(72) Inventor: Shingo Tanisaka, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/213,650

(22) Filed: Jul. 19, 2016

(65) Prior Publication Data

US 2017/0033528 A1    Feb. 2, 2017

(30) Foreign Application Priority Data

Jul. 29, 2015    (JP) ................. 2015-149210

(51) Int. Cl.
| | |
|---|---|
| *H01S 5/02* | (2006.01) |
| *H01S 5/022* | (2006.01) |
| *H01S 5/024* | (2006.01) |
| *H01S 5/40* | (2006.01) |

(52) U.S. Cl.
CPC ...... *H01S 5/02252* (2013.01); *H01S 5/02292* (2013.01); *H01S 5/02208* (2013.01); *H01S 5/02256* (2013.01); *H01S 5/02469* (2013.01); *H01S 5/4031* (2013.01)

(58) Field of Classification Search
CPC ............... H01S 5/02252; H01S 5/0292; H01S 5/02208; H01S 5/02256; H01S 5/02469; H01S 5/4031; H01S 5/02292; H01L 21/027

See application file for complete search history.

(56) References Cited

U.S. PATENT DOCUMENTS

| | | |
|---|---|---|
| 5,949,118 A | 9/1999 | Sakai et al. |
| 6,417,107 B1 | 7/2002 | Sekimura |
| 6,496,469 B1 | 12/2002 | Uchizaki |
| 7,456,434 B2 | 11/2008 | Kim et al. |
| 8,235,605 B2 * | 8/2012 | Kim ..................... G02B 6/4246 359/629 |

(Continued)

FOREIGN PATENT DOCUMENTS

| | | |
|---|---|---|
| JP | H06-316069 A | 11/1994 |
| JP | H09-082984 A | 3/1997 |

(Continued)

*Primary Examiner* — Armando Rodriguez

(57) ABSTRACT

A method for manufacturing an optical member includes providing a silicon substrate having a first main surface of a {110} plane, forming a mask pattern having an opening extending in a <100> direction on the first main surface of the silicon substrate, and forming a sloped surface of a {100} plane in the silicon substrate by wet etching the silicon substrate from a first main surface side using the mask pattern as a mask. A method for manufacturing a semiconductor laser device includes fixing the optical member formed by the method for manufacturing the optical member and a semiconductor laser element to a mounting board so that laser light emitted from the semiconductor laser element is irradiated to a reflective film of the optical member.

15 Claims, 7 Drawing Sheets

(56) References Cited

U.S. PATENT DOCUMENTS

| | | |
|---|---|---|
| 2002/0048962 A1 | 4/2002 | Sekimura |
| 2003/0063552 A1 | 4/2003 | Uchizaki |
| 2005/0169570 A1* | 8/2005 | Kim .................... G11B 7/1362 |
| | | 385/14 |
| 2011/0049554 A1 | 3/2011 | Wu et al. |
| 2011/0158273 A1 | 6/2011 | Okayama et al. |
| 2013/0177274 A1 | 7/2013 | Kosenko et al. |

FOREIGN PATENT DOCUMENTS

| | | |
|---|---|---|
| JP | 2000-077382 A | 3/2000 |
| JP | 2001-102676 A | 4/2001 |
| JP | 2003-188454 A | 7/2003 |
| JP | 2003-332699 A | 11/2003 |
| JP | 2005-203782 A | 7/2005 |
| JP | 2006-086492 A | 3/2006 |
| JP | 2006-216832 A | 8/2006 |
| JP | 2009-526390 A | 7/2009 |
| JP | 2010-522349 A | 7/2010 |
| JP | 2011-049562 A | 3/2011 |
| JP | 2011-138953 A | 7/2011 |
| JP | 2013-171879 A | 9/2013 |
| JP | 2015-515113 A | 5/2015 |
| WO | 2007-090856 A1 | 8/2007 |
| WO | 2008-114991 A1 | 9/2008 |
| WO | 2013106285 A2 | 7/2013 |
| WO | 2013-146749 A1 | 10/2013 |

* cited by examiner

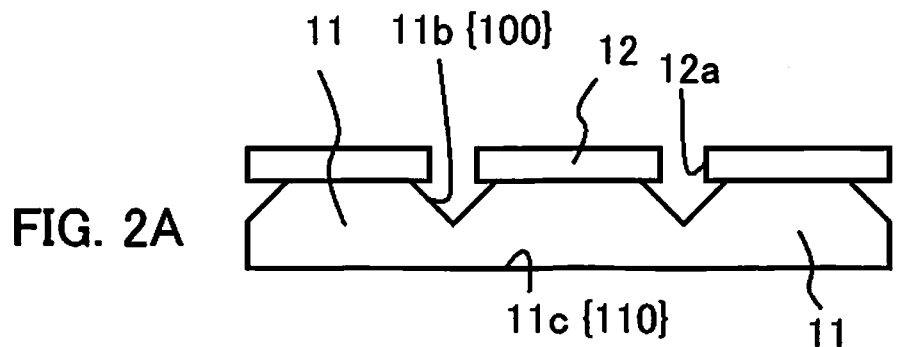
FIG. 2A
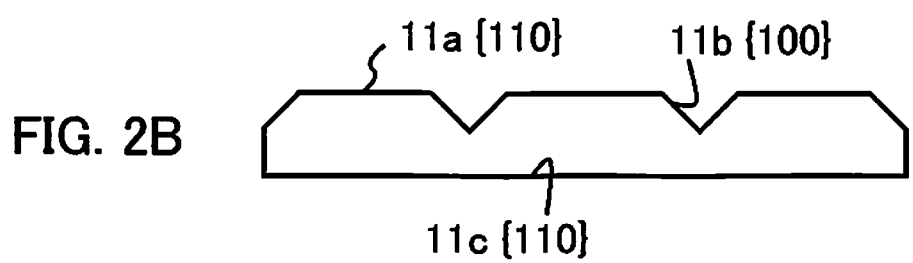
FIG. 2B
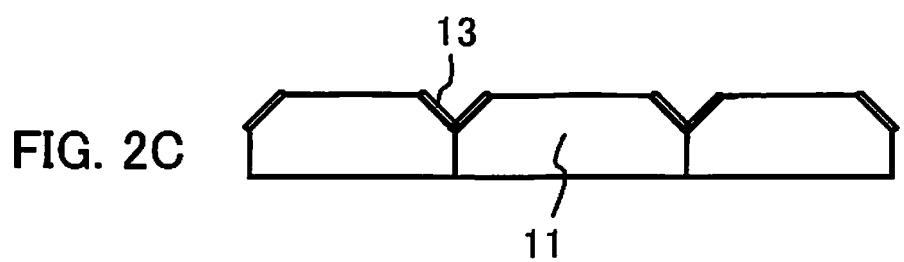
FIG. 2C
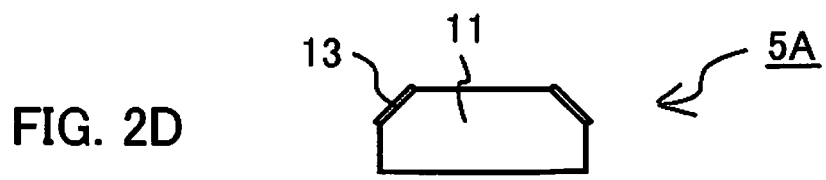
FIG. 2D
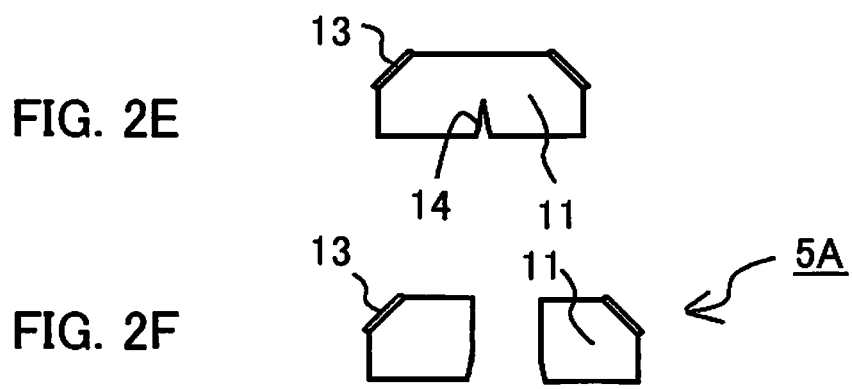
FIG. 2E
FIG. 2F

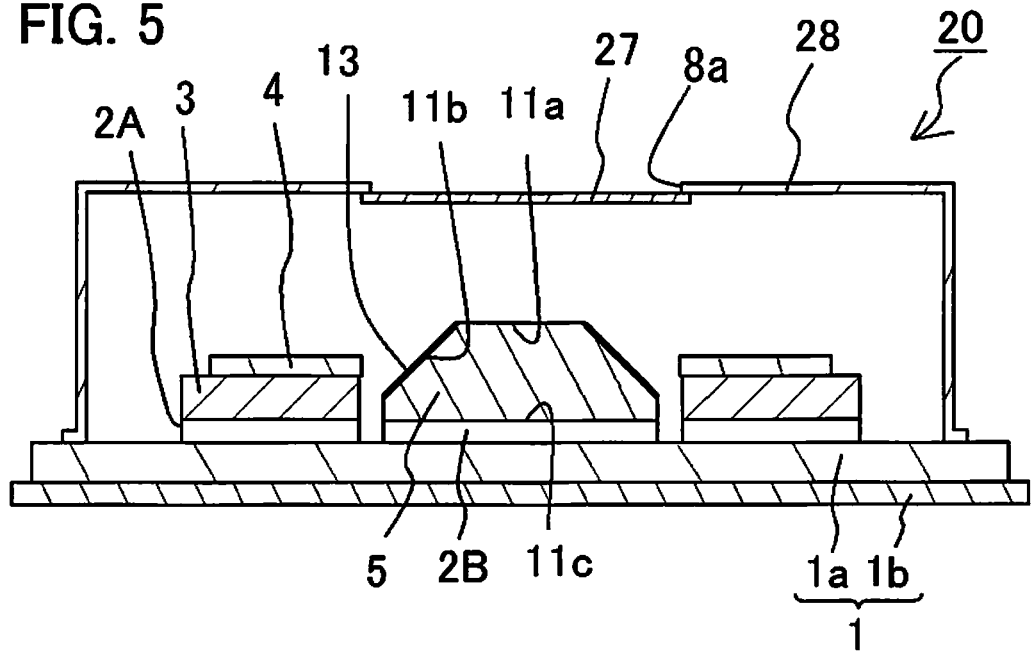
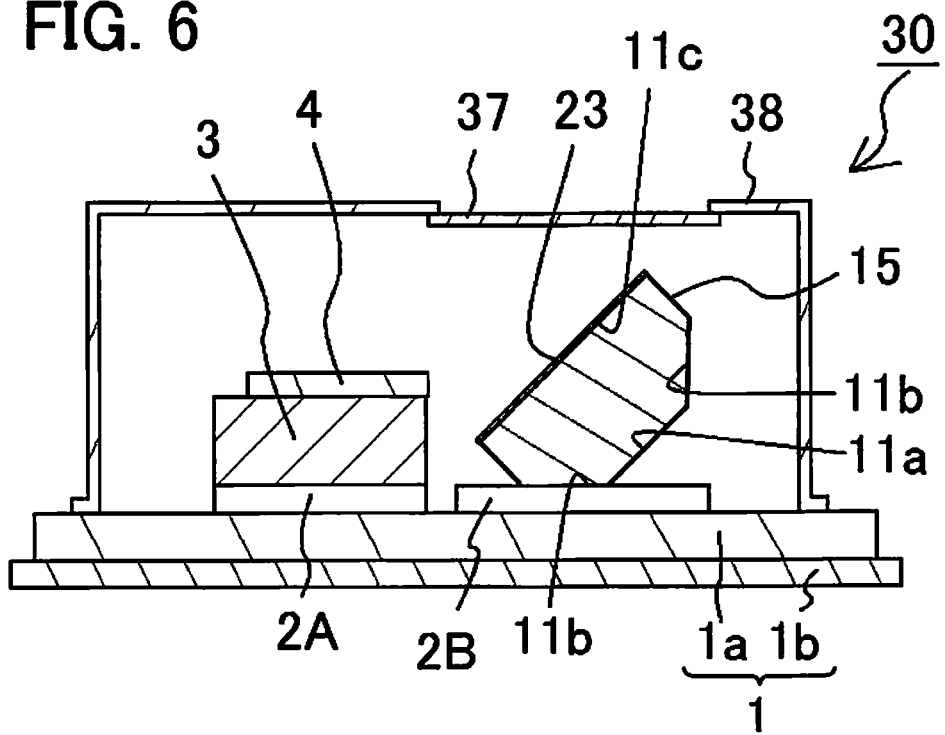

METHOD FOR MANUFACTURING OPTICAL MEMBER AND METHOD FOR MANUFACTURING SEMICONDUCTOR LASER DEVICE

CROSS REFERENCE TO RELATED APPLICATIONS

This application claims priority to Japanese Patent Application No. 2015-149210 filed on Jul. 29,2015. The entire disclosure of Japanese Patent Application No. 2015-149210 is hereby incorporated herein by reference.

BACKGROUND

1. Technical Field

The present disclosure relates to a method for manufacturing an optical member, a method for manufacturing a semiconductor laser device, and a semiconductor laser device.

2. Description of Related Art

In the field of optics, and especially for semiconductor lasers, there has been a need in recent years for smaller packages and higher output. Accordingly, a semiconductor laser device is proposed in which one or more laser elements and optical members corresponding to the laser elements, such as an optical member having a 45-degree sloped surface, are disposed in a single package, and laser light that is reflected perpendicularly on the sloped surface is collimated and used. Also, a method for manufacturing an optical member having a 45-degree sloped surface in which silicon is used and is subjected to wet etching, in order to provide an optical member having a 45-degree sloped surface at a low cost (for example, JP2000-77382A, JP2006-86492A, and JP2009-526390A).

However, it may not be easy to make a 45-degree sloped surface both smooth and precise in its angle. Also, a simple method for making such a mirror has not been established yet, and there has been a need for a simple method of highly precisely manufacturing an optical member including a sloped surface having high smoothness.

SUMMARY

It is an object thereof to provide a simple method for precisely manufacturing an optical member including a sloped surface having high flatness, as well as a semiconductor laser device including this high-precision optical member.

A method for manufacturing an optical member of the present disclosure includes providing a silicon substrate having a first main surface of a {110} plane, forming a mask pattern having an opening extending in a <100> direction on the first main surface of the silicon substrate, and forming a sloped surface of a {100} plane in the silicon substrate by wet-etching the silicon substrate from the first main surface side using the mask pattern as a mask.

Further, a method for manufacturing a semiconductor laser device of the present disclosure includes fixing the optical member described above and a semiconductor laser element to a mounting board so that laser light emitted from the semiconductor laser element is irradiated to a reflective film of the optical member.

Still fluffier, a semiconductor laser device of the present disclosure includes a mounting board, a semiconductor laser element disposed on the mounting board, and an optical member that is composed of silicon having a {110} plane and a {100} plane, in which either the {110} plane or the {100} plane is fixed on the mounting board and the other one is covered by a reflective film, and which reflects laser light emitted from the semiconductor laser element.

According to one embodiment of the present disclosure, an optical member including a sloped surface with high flatness can be simply and precisely manufactured, and a semiconductor laser device including this high-precision optical member can be provided.

BRIEF DESCRIPTION OF DRAWINGS

FIGS. 2A to 2F are schematic cross-sectional views illustrating an embodiment of the method for manufacturing an optical member in the present disclosure;

FIG. 5 is schematic cross-sectional view illustrating another embodiment of the semiconductor laser device of the present disclosure;

FIG. 6 is schematic cross-sectional view of another embodiment of the semiconductor laser device of the present disclosure;

DETAILED DESCRIPTION OF EMBODIMENTS

Figure 1A:
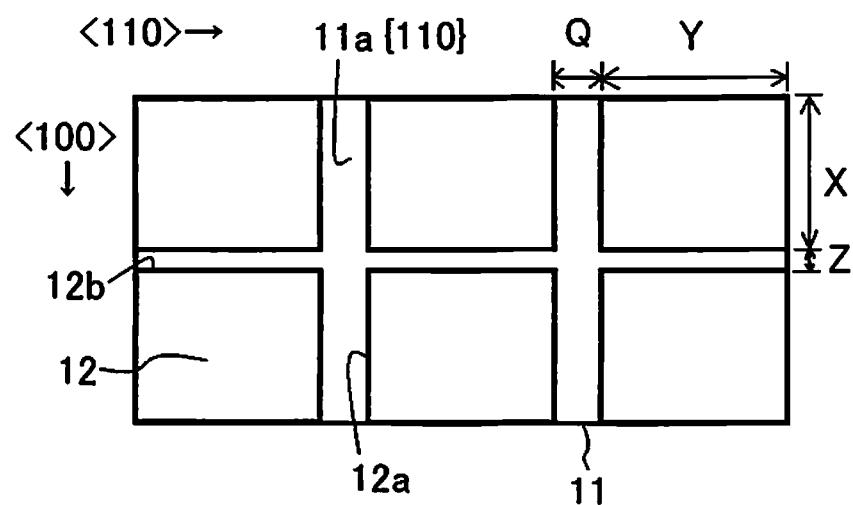
FIGS. 1A and 1B are a schematic plan view and a schematic cross-sectional view, respectively, illustrating an embodiment of a mask pattern on a silicon substrate in the present disclosure.

In the description below, embodiments of the present invention will be described appropriately referring to drawings. However, an illustration described below are intended as illustrative to give a concrete form to technical ideas of the present invention, and unless otherwise specified, the scope of the present invention is not limited to descriptions below. Also, description in one embodiment and in one example can be applied in other embodiments and examples. The sizes or positional relationships of members illustrated in each drawing may be exaggerated so as to clarify the description.

Embodiment 1: Method for Manufacturing Optical Member

The method for manufacturing the optical member of the present embodiment includes
(a) providing a silicon substrate having a first main surface of a {110} plane,
(b) forming a mask pattern having an opening that extend in a <100> direction on the first main surface of the silicon substrate, and
(c) forming a sloped surface having the {100} plane by wet etching the silicon substrate from the first main surface side using the mask pattern as a mask.
The method described above, may further includes (d) forming a reflective film on one side of the silicon substrate, or (e) dividing the silicon substrate.

a: Provision of Silicon Substrate

A silicon substrate having a first main surface of a {110} plane is provided. The term "{110} plane" here refers to {110} plane of the crystal lattice planes in a diamond structure of silicon, which is a crystal structure that is stable under normal temperature and normal pressure, and to crystal planes equivalent to {110} plane. The term "crystal planes equivalent to" means the family of equivalent crystal planes or facets defined by the Miller index. The first main surface of the silicon substrate may have an off angle of about ±2 degrees with respect to the {110} plane. The off angle is preferably ±1 degree, and more preferably ±0.2 degree.

The size and the thickness of the silicon substrate can be suitably adjusted in accordance with the application of the optical member to be obtained and so forth. It is preferable to obtain a plurality of optical members from a single silicon substrate, and accordingly, the silicon substrate may have a length and/or width of from a few centimeters to a few dozen centimeters.

The thickness of the silicon substrate is preferably uniform, but the silicon substrate may include portions of different thickness locally. It is also preferable that the first main surface of the silicon substrate and the second main surface on the opposite side are respectively a surface of the {110} plane. That is, the silicon substrate preferably has a second main surface that is parallel to the first main surface. The thickness of the silicon substrate can be in a range of 100 μm to a few thousand microns, for example, and can be in a range of 500 to 2000 μm, for instance.

b: Formation of Mask Pattern

A mask pattern is formed on the first main surface of the silicon substrate. This mask pattern includes openings, for example, extending in a <100> direction as shown in FIG. 1. The openings that extend in the <100> direction can be openings that extend in a direction parallel to the first main surface.

The term "the <100> direction" here refers to a direction perpendicular to (100) plane, which is one of the crystal lattice planes in a diamond structure of a silicon, which is a crystal structure that is stable at normal temperature and pressure, and all directions that are perpendicular to crystal planes equivalent to the (100) plane.

The openings in the mask pattern may be openings each having a stripe shape extending in the <100> direction. Also, the openings extending in the "<100> direction may link to openings extending in a direction perpendicular to the <100> direction (namely, in a <110> direction) to form a lattice pattern. For example, the openings extending in the <100> direction may link to openings extending in the <110> direction to form a lattice pattern. The openings extending in the <100> direction has outer edges (both sides) that are preferably parallel to the <100> direction. Also, the openings extending in the <110> direction has outer edges (both sides) that are preferably parallel to the <110> direction.

The length of the openings extending in the <100> direction can be suitably selected according to the size of the silicon substrate to be used. The width of the openings extending in the <100> direction can be suitably selected according to the height of the sloped surface to be obtained in a subsequent step, etc. For example, the width can be in a range of about 200 to 1000 μm. In the case of including an opening extending in a direction other than the <100> direction, a width of the opening may be the same as or different from the width of the openings extending in the <100> direction. The sloped surface formed by such opening extending in a direction other than the <100> direction is not related to function as an optical member. Thus, the width of openings extending in a direction other than the <100> direction is preferably less than the width of openings extending in the <100> direction. This allows the surface area of the silicon substrate to be used more efficiently. Also, the width of the openings may be fairly large in the case of being used for division grooves, and can be about 50 to 500 μm, for example.

The depth of the openings corresponds to the thickness of the mask pattern, and for example, is in a range about 0.1 to 1 μm.

The mask pattern can generally be formed using a material that is known in this field such as a resist film, an insulating film (an oxide film of silicon, hafnium, zirconium, aluminum, titanium, lanthanum, or the like) and by a known method such as photolithography and an etching step. It is particularly preferable to appropriately select the material of the mask pattern according to the type of etchant used in wet etching (discussed below).

In the case where the openings that extend perpendicular to the <100> direction, which are described above, are not formed in the mask pattern on the first main surface of the silicon substrate, a mask pattern and openings that extend perpendicular to the <100> direction may be formed on the second main surface of the silicon substrate.

c: Formation of Sloped Surface

The silicone substrate is wet-etched from the first main surface side thereof using the mask pattern as a mask, so that the sloped surface having a {100} plane is formed. The sloped surface preferably extends in the <100> direction and has an inclination angle of 45 degrees with respect to the second main surface (that is, the {110} plane) of the silicon substrate. In other words, the sloped surface preferably forms an angle of 135 degrees with respect to the first main surface of the silicon substrate is. The "(100) plane" referred to above may have an off angle of about ±2 degrees with respect to the {100} plane, and thus may be a plane having an inclination angle of about 45±2 degrees with respect to the second main surface. The off angle is preferably ±1 degree, and more preferably ±0.2 degree.

The etching described above is preferably be a wet etching, but may be any etching method that allows for anisotropic etching.

The wet etching may be performed using the above-described mask pattern as the mask under any conditions, so long as the etchant allows for anisotropic etching. Examples of the etchant include tetramethylammonium hydroxide (TMAH), potassium hydroxide, sodium hydroxide, ethylene diamine pyrocatechol (EDP), hydrazine, a mixture in which isopropanol is added to these, or a mixture of these. The concentration of the etchant can be suitably selected considering the etching rate of the silicon substrate or the like. Among materials described above, TMAH is preferably used for the etchant. This is because TMAH has higher anisotropy in the etching of the {110} plane of silicon substrate than other anisotropic etchants, and allows for precisely forming a sloped surface that is inclined by approximately 45 degrees from the main surface in the {110} plane of the silicon substrate. TTMAH is preferably used also because it is easy to handle.

The etching conditions may be such that, in the case where the etchant is TMAH, for example, the etchant temperature is set to be in a range of about 80 to 110° C., and the material is immersed for about 2 to 10 hours. The immersion time may be adjusted so as to achieve the desired amount of etching.

In the case where openings that extend in a direction perpendicular to the <100> direction, which are described above, are also formed in the mask pattern used in the description above, a surface is formed (see 11d in FIGS. 8A to 8C) having an inclination angle of about 35 degrees, which is the {111} plane, from a side extending in the <110> direction. This angle may also have an off angle of about ±2 degrees with respect to the {110} plane.

After forming the above-described sloped surfaces of 45 and 35 degrees, the etching is continued, which can form a groove with a cross sectional shape that is trapezoidal defined by the sloped surfaces extending from opposing sides in plan view, and when the etching proceeds further, the groove becomes V-shaped. Since silicon substrates cannot be cleaved in either the <100> direction or the <110> direction, in the case of forming a trapezoidal or preferably V-shaped groove, the etching is preferably continued until a V-shaped groove is formed, which allows for performing the division described below easily at the bottom of the V shape.

The sloped surfaces are preferably formed to a depth in a range of about a few hundred microns to a thousand and a few hundred microns, and especially in a range of about 200 to 1000 μm, from the first main surface of the silicon substrate.

d, d': Formation of Reflective Film

A reflective film may be formed on one side of the silicon substrate. The "one side" here can be appropriately selected according to a form of using the obtained silicon substrate. For example, a reflective film is preferably formed on either the obtained sloped surfaces or the second main surface. In the case where the reflective film is formed on the obtained sloped surfaces, the film will be formed at the angle at which the surface is inclined, which may lead to difficulty in controlling the film thickness, so that the quality of the film may be deteriorated. For this reason, it is particularly preferable to form the film on the second main surface.

The reflective film can be made of a material capable of reflecting at least 50% of light emitted from a semiconductor laser element, for example. In other words, the reflective film can have a reflectivity of at least 50% with respect to light having the oscillation wavelength of the semiconductor laser element. In the case of combining the reflective film with a high-output semiconductor laser element (for example, a semiconductor laser element having an optical output of at least 1 W), the film is preferably made of a material capable of reflecting at least 80%, at least 90% or at least 95% of light having the oscillation wavelength. Example of the reflective film include a single-layer or multilayer structure film of a metal such as gold, silver, copper, iron, nickel, chromium, aluminum, titanium, tantalum, tungsten, cobalt, ruthenium, tin, zinc, or an alloy of these (e.g., for an Al alloy, an alloy of Al and Cu, Ag, or a platinum group metal such as Pt may be used). When the reflective film is made of a metal, a single-layer film of a metal such as aluminum, gold, silver, or chromium is preferable.

The reflective film may be a dielectric multilayered film or the like in which two or more kinds of dielectrics are laminated. This dielectric multilayered film is preferably a DBR (distributed Bragg reflector) film. Examples of the dielectrics forming the DBR film include an oxide film or a nitride film of at least one element selected from the group consisting of silicon, titanium, zinc, niobium, tantalum and aluminum. Among them, a layered structure of the oxide of silicon, zinc, niobium, tantalum or aluminum. Further, a first layer of the reflective film preferably has good adhesion to the silicon, and for example, Si-containing layer such as $SiO_2$ is considered to be suitable to serve as the first layer. By adjusting the material and thickness of the various layers of the dielectric multilayer film, the dielectric multilayered film can have a desired reflectivity.

It is particularly preferable for the reflective film to be formed by a dielectric multilayer film. Using the dielectric multilayer film can increase the reflectivity with respect to the oscillation wavelength of the laser, as compared to a reflective film formed of a metal. More specifically, the reflectivity can be close to 100%. With this arrangement, an optical member with less light absorption, that is, less heat generation can be realized. Accordingly, a semiconductor laser device with high output can be obtained. The reflectivity of the dielectric multilayered film changes in accordance with the change in the thickness of each layer of the dielectric multilayered film, so that it is preferable to form the film perpendicular to a surface on which the film is to be formed in a wafer state so that the film having a thickness that is the same as the designed value can be obtained. Therefore, it is more preferable that the dielectric multilayer film is formed on the second main surface (the {110} plane) of the silicon substrate.

The thickness of the reflective film may be in a range of about a few tenth micrometer to about a few dozen micrometer, for example, preferably in a range of about 0.1 to 10 micrometer, and more preferably 0.3 to 7 micrometer.

The reflective film can be formed by a method known in this art such as a vacuum deposition method, ion plating method, ion vapor deposition (IVD) method, sputtering method, ECR sputtering method, plasma deposition method, chemical vapor deposition (CVD) method, ECR-CVD method, ECR-plasma CVD method, electron beam evaporation (EB) method, an atomic layer deposition (ALD) method. In any method of forming the reflective film, the formation of the film is performed perpendicularly to the surface on which the film is to be formed.

As described above, forming the reflective film after forming the above-described sloped surfaces allows for forming the reflective film having good angle precision, high smoothness, or the like, and good film quality. Accordingly, the reflection efficiency and durability of the optical member can be enhanced. Also, the optical member can be manufactured efficiently, easily, simply, and at high precision. Furthermore, the manufacturing cost of the optical member itself can be reduced.

e: Division of Silicon Substrate

The silicon substrate may be divided appropriately. This division may be performed before or after the formation of the above-described reflective film.

The division of the silicon substrate is preferably performed in a direction along a 45-degree sloped surface, for example, that is, in the <100> direction. As described above, in the case of forming sloped surfaces on the silicon substrate, a groove with trapezoidal or V-shaped cross section is formed defined by one or two sloped surfaces, so that the division is preferably carried out inside the trapezoidal or V-shaped groove along the direction of the groove. Consequently, in the case where the mask pattern includes a plurality of openings, two sloped surfaces can be formed on both sides of a single optical member.

Also, in the case where the {110} plane (first main surface) of the silicon substrate is present between two sloped surfaces, the substrate may be further divided in a direction parallel to the direction extending in the <100> direction, in the {110} plane of the silicon substrate. This division can form a single optical member having just one sloped surface.

Regardless of whether or not etching is performed in the above-described direction extending in the <100> direction, it is preferable to perform division also in a direction perpendicular to the direction along the sloped surfaces, that is, the <110> direction. For this division, a groove defined by slopes formed by etching in a direction extending in the <100> direction may be used, or an auxiliary division groove or crack described below may be used.

At the time of dividing the silicon substrate, it is preferable to form an auxiliary division groove and/or crack and perform division. This auxiliary groove and/or crack can be formed, for example, by known methods such as blade dicing or laser dicing. Among these, it is preferable to use laser dicing that allows for internal processing of a material. With this method, cracks can be formed over approximately the entire surface, no matter how thick the material is, and generation of debris during division can be reduced. In the case of using laser dicing that allows internal processing, an internal-processing laser is emitted by, for example, the laser dicing device to form cracks directly under the V-shaped grooves, and then, as shown in FIG. 2D, the silicon substrate 11 is divided with a breaking device from the lower ends of the V-shaped grooves, which serve as the starting point of the breaking.

The size of the silicon substrate after division can be selected appropriately. For example, a side of the silicon substrate in the <110> direction can be 2.0 mm, and a side in the <100> direction can be 1.0 mm.

Embodiment 2: Semiconductor Laser Device

Figure 4A:
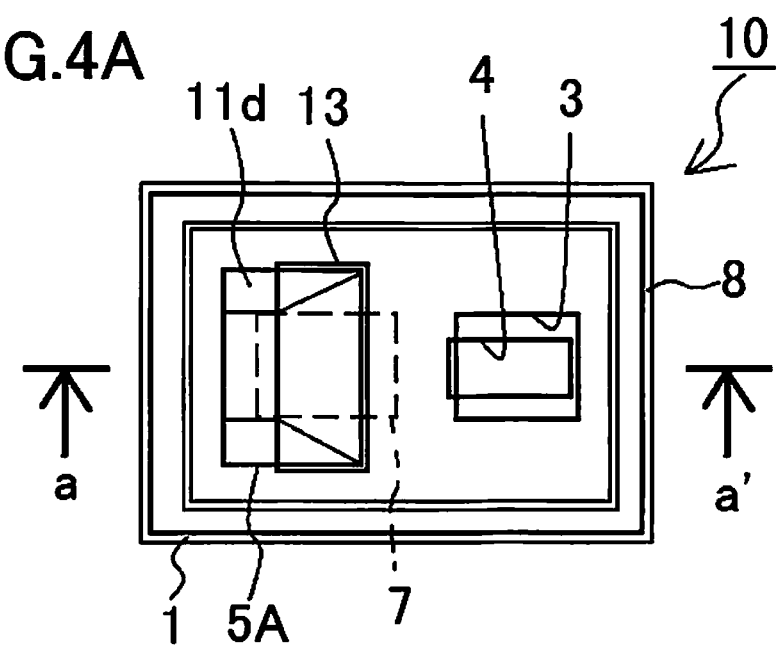
FIGS. 4A and 4B are a schematic plan view and a schematic cross-sectional view taken along the a-a' line of FIG. 4A, respectively, showing an embodiment of the semiconductor laser device of the present disclosure.
Figure 4B:
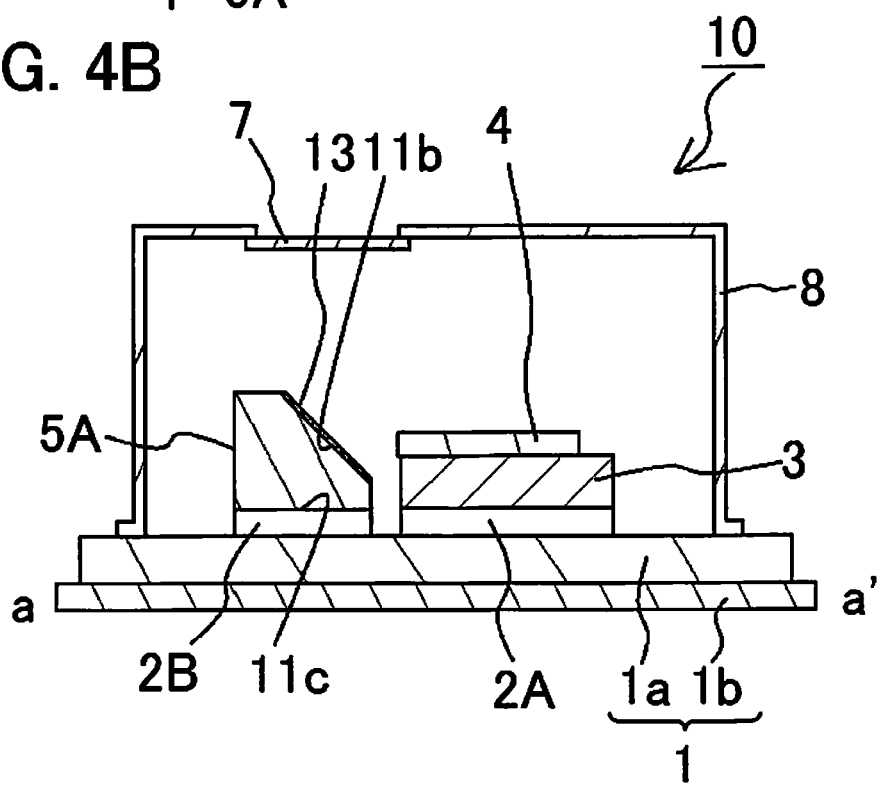

As shown in FIGS. 4A and 4B, for example, the semiconductor laser device in this embodiment includes:

a mounting board 1;

a semiconductor laser element 4; and an optical member 5 that is made of silicon having the {110} plane and the {100} plane, in which one of the {110} plane or the {100} plane is fixed on the mounting board and the other one is covered by a reflective film to reflect laser light emitted from the semiconductor laser element 4.

Optical Member 5

The optical member 5 is a member for reflecting laser light emitted from the semiconductor laser element 4 to an intended direction. The optical member 5 is preferably made of silicon (Si). Silicon has better thermal conductivity than a conventional optical member made of quartz (a so-called prism), so that it is particularly advantageous for use in high-output lasers in which the output of the semiconductor laser element is 1 W or higher.

The optical member preferably has surfaces of the {110} plane and the {100} plane of silicon. That is, a reflecting surface of the optical member 5 to reflect laser is preferably one of the {110} plane and the {100} plane. In the present specification, the {110} plane and the {100} plane allows inclination due to an off angle of about ±2 degrees. It is preferable that one of the {110} plane and the {100} plane of silicon is fixed on the mounting board, and the other is covered by a reflective film. For example, the {110} plane can be fixed on the mounting board, and the {100} plane can be covered by a reflective film and used as the reflecting surface to reflect laser light. The "{100} plane" referred to here indicates a plane that is at a 45-degree angle with respect to the {110} plane.

This the {110} plane preferably corresponds to the second main surface of the silicon substrate in the above-mentioned method for manufacturing an optical member, for example, while the {100} plane is preferably a sloped surface formed by etching using a mask pattern having openings that extend in the <100> direction.

Generally, the optical member 5 in which the {110} plane or the {100} plane that serves as the reflecting surface is covered with a reflective film as described above is used.

The optical member 5 is disposed opposing the semiconductor laser element 4. The "disposed opposing" in this case means that laser light emitted from the semiconductor laser element 4 is irradiated to the reflecting surface of the optical member 5 (that is, the surface covered with the reflective film), and the optical member 5 is disposed at a position where the reflecting surface can reflect this laser light so as to face the semiconductor laser element 4. For example, the reflecting surface of the optical member is disposed so as to be inclined with respect to an end portion of the semiconductor laser element on an optical member side. This reflecting surface reflects laser light, which allows the optical axis of the laser light emitted from the semiconductor laser element 4 to be changed to another direction. In the case where laser light from the semiconductor laser element is emitted parallel to a main surface of the mounting board, then light from the semiconductor laser element 4 can be emitted perpendicularly to the mounting board 1 by selecting the angle formed by the sloped surface and the main surface of the mounting board to be 45 degrees ±2 degrees, and preferably 45 degrees ±1 degree, and more preferably 45 degrees ±0.2 degree.

There are no particular restrictions on the shape of the optical member 5, as long as the optical member 5 includes the above-described reflecting surface, and any of various shapes can be employed. For example, the shape of the optical member 5 may be a polygonal column, a polygonal truncated pyramid, or a combination of these shapes. The optical member 5 may further have a sloped surface inclined with respect to the {110} plane (see 11d in FIGS. 8A to 8C). The inclination angle of the {110} plane of the sloped surface is less than the inclination angle of the {100} plane with respect to the {110} plane, and for example, is about 35 degrees.

The reflecting surface of the optical member 5 is disposed preferably within about 10 to 150 μm from the semiconductor laser element, and more preferably within about 20 to 100 μm.

A single optical member 5 may be disposed on the mounting board, or a plurality of optical member 5 may be disposed on the mounting board. In the case of disposing the plurality of optical member 5, they are preferably disposed in a matrix, for example. Also, one optical member 5 may be disposed for each semiconductor laser element, or one optical member 5 may be disposed for a plurality of semiconductor laser elements.

The optical member 5 is generally disposed on the mounting board 1 via a metal layer and/or an adhesive member. The metal layer may be disposed in an area that is smaller than an area of the surface of the optical member 5 that is fixed to the mounting board 1 and/or a planar area of the optical member 5, or may be disposed in a planar area equal to the planar area of these. Also, it may be disposed extending out from the edges of the surface of the optical member 5 that is fixed to the mounting board 1. This can ensure a path of heat dissipation from the optical member 5.

The metal layer may be formed of a single layer of metal such as gold, silver, or aluminum, or is a layered structure including these metals. More specifically, examples of the metal layer include a layered structure such as Ti/Pt/Au, Ni/Au, Ni/Pd/Au or Ni/Pd/Au/Pd. In the case where the outermost surface of the metal layer is gold, all or a portion of the gold may diffuse into the adhesive member (discussed below) such as a gold-based solder. In this case, the diffused gold functions as an adhesive member. The metal layer can be formed by any method known in this field, such as vapor deposition method, sputtering method, or plating method. Among these, forming by sputtering is particularly preferable.

Examples of the adhesive member include an adhesive member made of a metal material such as Au-based solder material (e.g., AuSn-based solder, AuGe-based solder, AuSi-based solder, AuNi-based solder, AuPdNi based solder) or Ag-based solder material (e.g., AgSn based solder). In the case of using the adhesive member, the optical member and the mounting substrate are bonded so that contact surfaces of the mounting substrate or the metal layer and the optical member are bonded via the adhesive member, after which these are kept under a predetermined temperature and pressure. For example, thermocompression bonding can be used for such bonding. From the viewpoint of heat dissipation, the adhesive member is preferably disposed over the entire surface between the mounting board or metal layer and the optical member. Also, an adhesive agent such as a UV-setting adhesive agent, a thermosetting adhesive agent may be used.

Mounting Board 1

The mounting board 1 is used to mount the semiconductor laser element 4, the optical member 5, and other components that constitute the semiconductor laser device. The mounting board 1 is utilized also to allow heat generated in the semiconductor laser element 4 to be efficiently released to the outside. The mounting board 1 is typically made of an electrically insulating ceramics such as AlN, SiC, or aluminium oxide. In view of heat dissipation, another metal member (such as copper or aluminum), another insulating ceramics made of another material, or the like may be further disposed on the lower surface of the insulating ceramics.

The thickness of the mounting board 1 can be appropriately selected, and an example thereof is about 0.2 to 5 mm.

There are no particular restrictions on the size and shape of the mounting board 1, which can be suitably adjusted according to the size, shape, and so forth of the semiconductor laser device to be obtained. Examples of the planar shape include polygons such as rectangle, circle, ellipse, or the like. The mounting board 1 may have irregularities or the like on the surface thereof, but the surface is preferably flat. An example of the mounting board 1 is a plate-like, rectangular mounting board 1 with a side of about 2 to 30 mm.

The mounting board 1 may include a wiring pattern on a front surface thereof. Also, the mounting board 1 may include terminals for connecting to an external power supply. The wiring pattern or the like may be embedded inside the mounting board 1. With the arrangement of the terminals on the front surface of the mounting board for connecting to an external power source, the entire back surface of the mounting board 1 can serve as a heat dissipation surface.

Submount 3

A submount 3 may be arranged on the mounting board 1. In this case, the semiconductor laser element 4 is arranged on the submount 3. The submount 3 is made of a material with good thermal conductivity to aid in the heat dissipation of the semiconductor laser element 4, and is preferably made of a material having thermal conductivity higher than that of silicon. Examples of such material include AlN, CuW, diamond, SiC and ceramics. Among these, the submount is preferably made of monocrystalline AlN or SiC.

The submount 3 may have an appropriate thickness, and an example thereof is in a range of about 100 to 500 μm, preferably about 120 to 400 μm and more preferably about 150 to 300 μm. With a thickness of the submount 3 greater than a certain value, light from the semiconductor laser element can be efficiently reflected by the reflecting member and extracted. The submount 3 may have a thickness such that the light emission point of the semiconductor laser element to be located upper side than the lower end of the reflective film. The height of the semiconductor laser element is preferably selected so that a desired portion of the light emitted from the semiconductor laser element (more specifically, a portion of light having light intensity to be reflected) is to be incident on the reflective film.

The submount 3 may have any appropriate planar shape, and examples thereof include polygons such as rectangle, circle, ellipse, and shapes similar to these. The size of the submount 3 can be appropriately adjusted according to the heat dissipation and the characteristics of the semiconductor laser device to be obtained. For example, the submount 3 has an area greater than an area of the surface of the semiconductor laser element 4 in plan view. That is, in plan view, the submount 3 has a length and width greater than the length and width of the semiconductor laser element 4, respectively. With this arrangement, all or substantially all of the semiconductor laser element 4 can be disposed on the submount 3, which allows for ensuring a heat dissipation path.

One submount 3 or a plurality of submounts 3 may be disposed on the mounting board 1. In the case of disposing a plurality of submounts 3, they are preferably disposed in a matrix, for example.

The submount 3 is usually disposed on the mounting board 1 via the above-described metal layer and/or adhesive member. The metal layer may be disposed in a planar area that is less than the planar area of the submount 3, or may be disposed in a planar area equal to the planar area of the submount 3. Also, it may be disposed extending out from the edges of the submount 3.

Semiconductor Laser Element 4

In the semiconductor laser element 4, when voltage is applied and current flows at or above a threshold value, laser oscillation occurs at the active layer and a region surrounding the active layer, and the generated laser light is emitted through a waveguide region to the outside. This semiconductor laser element 4 can be any known laser element having a structure in which a plurality of semiconductor layers are layered. For instance, examples of the semiconductor laser element 4 include an element having a structure in which an n-type semiconductor layer, an active layer, and a p-type semiconductor layer are layered in that order over a conductive substrate, and an insulating film, electrodes, and the like are formed on a surface of the semiconductor layer. Examples of the material of the semiconductor layer include a group III-V compound, and a nitride semiconductor is particularly preferable.

The semiconductor laser element 4 is arranged on the submount 3. With this arrangement, heat generated from the semiconductor laser element 4 can be efficiently escaped through the submount 3 or the like to the mounting board 1. The semiconductor laser element 4 may be junction-up mounted (i.e., face-up mounted), in which the substrate side is the mounting surface, but is preferably junction-down mounted (i.e., face-down mounted). With the junction-down mounting, a portion of the semiconductor laser element 4 in which the oscillation occurs can be close to the submount 3 and the mounting board 1 below. Such arrangement of the portion of laser light oscillation, in which heat can easily be generated, to be close to the submount 3 and the mounting board 1 allows for more effective heat dissipation. In the case of junction-down mounting, the semiconductor laser element 4 is preferably disposed so that a portion of the semiconductor laser element 4 protrudes to the optical member 5 side beyond the end of the submount 3. The protruding length can be about 10 to 20 μm, for example. This can reduce reflection of the laser light by the submount, and can also shorten the distance between the semiconductor laser element 4 and the optical member 5 in a direction parallel to the surface of the mounting board. That is, the semiconductor laser element 4 can be arranged close to the optical member 5 (discussed below). With this arrangement, the semiconductor laser device can be smaller in size. Also, generally, heat is generated at a semiconductor layer side of the semiconductor laser element 4, so that heat dissipation can be better improved by junction-down mounting, in which the semiconductor layer side can serve as the mounting board side, that is, the portion where heat is generated can be located close to the submount 3 or the mounting board 1.

One semiconductor laser element 4 or a plurality of semiconductor laser elements 4 may be disposed on one submount 3. The plurality of semiconductor laser elements 4 may all have the same wavelength band, or may have different wavelength bands. Also, the plurality of semiconductor laser elements 4 may be disposed in a matrix.

Cap

A semiconductor laser device 10 further includes a cap 8 attached to the mounting board 1 so as to cover the semiconductor laser element 4 and the optical member 5, and this cap is preferably sealed, and more preferably is sealed airtight. In particular, in the case of using a semiconductor laser element 4 in which a semiconductor material with an oscillation wavelength of about 300 to 600 nm (such as a nitride semiconductor) is used, organic material, moisture, or the like can easily be collected. For this reason, arrangement of the cap 8 can increase airtightness inside the laser device and can increase waterproof performance and dustproof performance. Also, in this case, members disposed in the interior of the laser device that is sealed airtight by the cap 8 are preferably members that do not contain any resin or other organic matter.

Examples of the shape of the cap 8 include a bottomed cylinder (a circular cylinder, polygonal cylinder, etc.), a truncated cone (a circular truncated cone, a polygonal truncated pyramid, etc.), a dome, and modifications of these shapes. The cap 8 can be made of a material such as nickel, cobalt, iron, a Ni—Fe alloy, Kovar, brass, or the like. The cap 8 arranged on the mounting board 1 preferably has an Is opening in one surface thereof. It is preferable that a light-transmissive member 7 arranged in the opening. Laser light can be extracted from the light-transmissive member 7. The cap 8 can be fixed to the mounting board 1 by a known method such as resistance welding, soldering, or another known method.

Lens

A lens serves to diffuse, converge, or turn the laser light into parallel light. The lens may be disposed in the emission direction of the laser light reflected by the optical member mirror, or the lens may be disposed on a portion to which laser light from the semiconductor laser element is irradiated, which is between the semiconductor laser element and the optical member.

The lens is made of a material that can transmit laser light, and can be made of any material that is typically used, such as glass, quartz, synthetic quartz, sapphire, transparent ceramics, and plastics. To accommodate various kinds of application, it is preferable for the light extracted from the semiconductor laser device to be turned into parallel light, and for this purpose, it is preferable to use a collimating lens so that the laser light will be emitted from the semiconductor laser device in the form of parallel light. The lens may have any appropriate shape, but the shape of the lens is preferably circular or elliptical. The size of the lens can be determined appropriately according to the laser light that is to be extracted from the semiconductor laser device.

Embodiment 3: Method for Manufacturing Semiconductor Laser Device

The method for manufacturing a semiconductor laser device in this embodiment includes;

fixing the above-described optical member and semiconductor laser element to a mounting board so that laser light emitted from the semiconductor laser element can be irradiated to the reflective film of the optical member.

The semiconductor laser element may first be fixed to the mounting board, and then the optical member fixed to the mounting board so that laser light emitted from the semiconductor laser element to strikes the reflective film of the optical member, or the optical member may first be fixed to the mounting board, and then the semiconductor laser element fixed to the mounting board so that laser light strikes the reflective film of the optical member, or both may be fixed to the mounting board at the same time.

Fixing the semiconductor laser element and the optical member in these manners allows laser light emitted from the semiconductor laser element to be reflected in a direction that is different from the emission direction.

In the case where the optical member is fixed to the mounting board, the surface of the optical member to face the mounting board is preferably fixed to the mounting board so as to be at a 45-degree angle with respect a surface of the mounting board surface. Accordingly, the surface of the optical member that to face the mounting board is preferably either the {110} plane or the {100} plane of the silicon substrate, and it is more preferable that the surface is the {100} plane. With this arrangement, the {110} plane, which has not undergone the above-described etching, can serve as the reflecting surface. Such the {110} plane has no surface roughness or flaws caused by etching, which is more suitable to serve as the reflecting surface. In the case where the {110} plane is fixed to the mounting board, the {100} plane can be the reflecting surface that is inclined at a 45-degree angle with respect to the surface of the mounting board, and in the case where the {100} plane is fixed to the mounting board, the {110} plane can be the reflecting surface that is inclined at a 45-degree angle with respect to the surface of the mounting board.

In the case where the optical member is fixed to the mounting board, the optical member is preferably fixed via a metal layer and/or an adhesive member, as described above.

In the case where the semiconductor laser element is fixed to the mounting board, it is preferable that the semiconductor laser element is fixed to the submount and the submount is then fixed to the mounting board via the metal layer and/or the adhesive member, or that the submount is fixed to the mounting board, and the semiconductor laser element is fixed to this submount. In this case, in the case where the semiconductor laser element is junction-down mounted, as described above, the semiconductor laser element is preferably disposed so that a portion of the semiconductor laser element preferably protrudes from an end of the submount toward the optical member. The semiconductor laser to element, the submount, and the mounting board can be fixed via the above-mentioned metal layer and/or adhesive member.

The optical member is fixed to the mounting board, thereafter, the semiconductor laser element is fixed to the mounting board, which allows for image-recognizing the position of the optical member using a camera or the like, and determining a position on which the semiconductor laser element is mounted based on the position of the optical member as a reference. Consequently, the semiconductor laser element and the optical member can be mounted at the accurate location by a simple method.

After fixing the semiconductor laser element and the optical member to the mounting board, these members are electrically connected by die bonding, wire bonding, or the like.

In the case of mounting a lens, positioning and bonding of the lens may be appropriately performed. After determining the portion on which the lens is to be mounted, the lens is fixed at an appropriate portion using an epoxy resin, acrylic resin, or other such UV-curing adhesive, a thermosetting adhesive, or the like.

In the case where the semiconductor laser device is sealed with a cap, the cap may optionally be bonded to the mounting board by resistance welding, soldering, or the like. This sealing can be performed in dry air, a nitrogen atmosphere, or the like at a dew point of −10 ° C. or lower. It is preferable to perform a pretreatment involving ashing, heat treatment, or another such method to remove any moisture or organic material adhered to the members.

Examples of the method for manufacturing an optical member, the method for manufacturing a semiconductor laser device, and the semiconductor laser device of the present invention is described below in detail through reference to the drawings.

EXAMPLE 1

Method for Manufacturing Optical Member a: Provision of Silicon Substrate

Figure 1B:
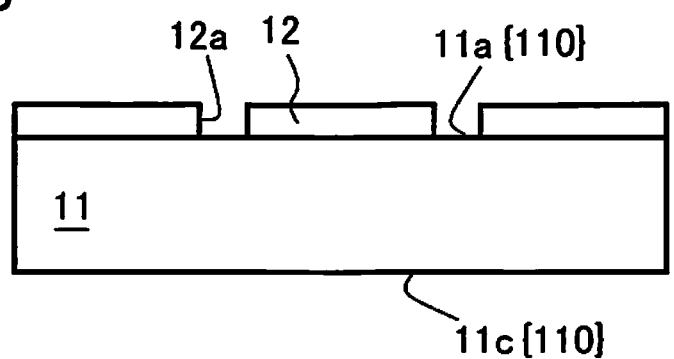

First, a silicon substrate 11 is provided as shown in FIGS. 1A and 1B. This silicon substrate 11 has the {110} plane as its first main surface 11a and its second main surface 11c. The thickness of the silicon substrate 11 is 500 µm, for example.

b: Formation of Mask Pattern

An $SiO_2$ film was formed using a CVD device over substantially the entire surface of the first main surface 11a of the silicon substrate 11. Then, using photolithography method, a mask-formation pattern having openings running along the <100> direction and the <110> direction is formed, and the $SiO_2$ film is wet-etched using buffered hydrofluoric acid. In this manner, a mask pattern 12 having openings 12a and 12b running along the <100> direction and the <110> direction was formed. That is, the mask pattern 12 is made of $SiO_2$. In the mask pattern 12, the opening 12 had the width Q of 600 µm, and the width Z of 300 µm. Also the length X of the mask pattern along the side in the <100> direction was 500 µm, and the length Y of the side in the <110> direction was 700 µm.

c: Formation of Sloped Surfaces

Next, as shown in FIG. 2A, using the mask pattern 12 as a mask, the first main surface 11a (the {110} plane) of the silicon substrate 11 was wet-etched for 240 minutes with TMAH at a temperature of approximately 90° C. With this, along the <100> direction, 45-degree sloped surfaces with a depth of approximately 400 µm was exposed from the first main surface 11a. The surfaces facing these 45-degree sloped surfaces were also 45-degree sloped surfaces, which formed grooves that were substantially V-shaped in cross section. These 45-degree sloped surfaces 11b were the {100} plane.

At the same time, along the <110> direction, 35-degree sloped surfaces with a depth of approximately 300 µm were exposed from the first main surface 11a. The surfaces facing these 35-degree sloped surfaces were also 35-degree sloped surfaces, which formed grooves that were substantially V-shaped in cross section.

After this, the mask pattern 12 was removed with buffered hydrofluoric acid as shown in FIG. 2B.

d: Formation of Reflective Film

As shown in FIG. 2C, an aluminum film of 200 nm was formed on thus-obtained the {100} plane of the silicon substrate 11, which was the sloped surfaces 11b, using a sputtering device, so that reflective films 13 were formed. These reflective films 13 each had a reflectivity of approximately 92%. In the present example, since surfaces on which the reflective films were to be formed were inclined at 45 degrees, it was difficult to control thickness of the reflective films to be formed. Accordingly, a metal film whose thickness can be easily controlled even in the case of being formed on a sloped surface was formed as the reflective film.

e: Division of Silicon Substrate

Next, as shown in FIG. 2D, the silicon substrate 11 was divided along the center of the etched V-shaped grooves (i.e., the portion at the apex of the V shape) extending in the <100> direction and the <110> direction of the silicon substrate 11.

Figure 8A:
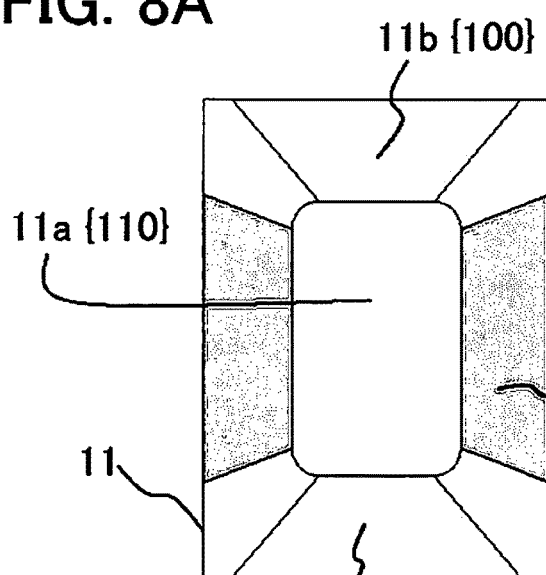
FIGS. 8A, 8B and 8C are a plan view, a vertical side view, and a lateral side view, respectively, illustrating surfaces of the silicon substrate obtained by the method for manufacturing a semiconductor laser device in the present disclosure.
Figure 8B:
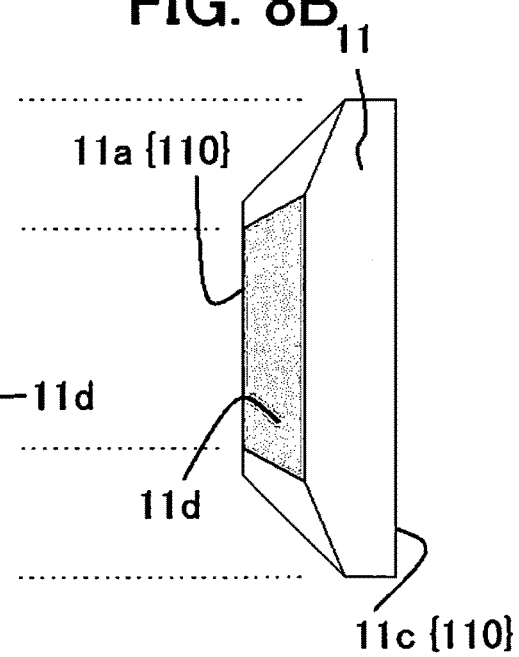
Figure 8C:
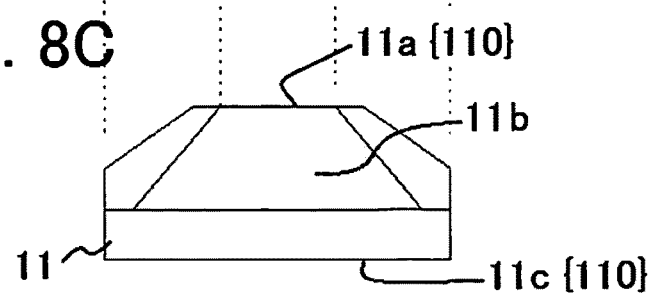

With this division, an optical member can be obtained from a silicon substrate 11 having a substantially rectangular planar shape. As shown in FIGS. 8A to 8C, this optical member can have two different types of sloped surfaces, that is, two 45-degree sloped surfaces (i.e., the {100} planes 11b), and two 35-degree sloped surfaces (i.e., surfaces 11d), and the two 45-degree sloped surfaces can serve as the reflecting surfaces. The {100} planes 11b and the 35-degree sloped surfaces 11d are connected by, for example, surfaces each having a plurality of planar orientations with inclination angles that are gradually different. They may also be connected by curved surfaces that are rounded.

As shown in FIG. 2E, optionally, auxiliary grooves 14 may be formed in the { 110} plane of the silicon substrate, which is the second main surface 11c, along the <100> direction of the silicon substrate 11 at a portion between V grooves, and the silicon substrate 11 may be divided from the auxiliary grooves 14 in the <100> direction as shown in FIG. 2F. In this manner, an optical member 5A in which just one sloped surface of 45-degree serves as a reflecting surface.

EXAMPLE 2

Method for Manufacturing Optical Member

Similarly to Example 1, 45-degree sloped surfaces (surfaces 11b in FIGS. 8A to 8C) and 35-degree sloped surfaces (surfaces 11d in FIGS. 8A to 8C) that define substantially V-shaped cross sections are formed in the silicon substrate 11.

d': Formation of Reflective Film

Figure 3A:
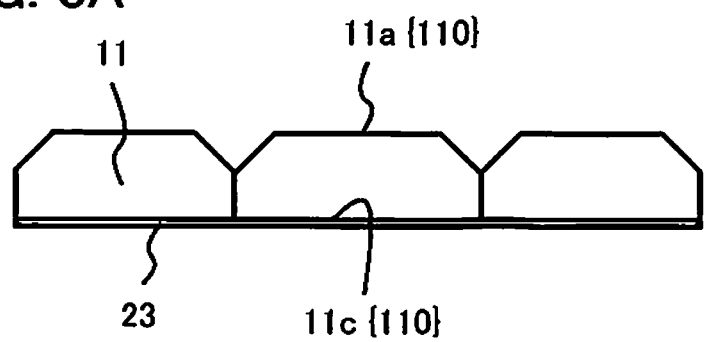
FIGS. 3A and 3B are schematic cross-sectional views illustrating an embodiment of the method for manufacturing an optical member in the present disclosure.

As shown in FIG. 3A, a layered structure having seven pairs of $SiO_2$ film/$ZrO_2$ film (75 nm/50 nm) (for a total film thickness of 875 nm) is formed using an ECR device on the obtained {110} plane of the silicon substrate 11, which is the second main surface 11c, to form a reflective film 23. The reflectivity of this reflective film 23 is approximately 99%.

Figure 3B:
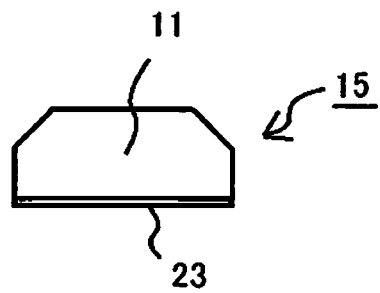

After this, similarly to Example 1, the silicon substrate is divided as shown in FIG. 3B to form an optical member 15 in which two 45-degree sloped surfaces serve as reflecting surfaces.

EXAMPLE 3

Semiconductor Laser Device

As shown in FIGS. 4A and 4B, a semiconductor laser device 10 in this Example mainly includes a mounting board 1, a submount 3 arranged on the mounting board 1, a semiconductor laser element 4 arranged on the submount 3, and an optical member 5A. The semiconductor laser element 4 and the optical member 5A are sealed airtight by the cap 8.

The mounting board 1 includes a rectangular insulating ceramic plate 1a made of AlN and a metal member 1b made of copper that is disposed on a lower surface of the ceramic plate 1a.

On a top surface of the mounting board 1, metal layers 2A and 2B are disposed at portions on which the semiconductor laser element 4 and the optical member 5A are mounted, respectively, so as to be apart from each other.

The metal layer 2A has such a structure that titanium (having thickness of 0.06 μm) and platinum (having thickness of 0.2 μm) layered in that order from the mounting board 1 side, over which is disposed an Au-Sn-based eutectic solder (having thickness of 3 μm). The metal layer 2B has such a structure that titanium (having thickness of 0.06 μm), platinum (having thickness of 0.2 μm), gold (having thickness of 1 μm), and palladium (having thickness of 0.3 μm) laminated in that order from the mounting board 1 side, over which is disposed an Au-Sn-based eutectic solder (having thickness of 3 μm).

The optical member 5A is made of silicon, and has the {110} plane, which is the second main surface 11c fixed to the mounting board 1, and the {100} plane, which is the sloped surface 11b that is inclined 45 degrees with respect to the second main surface 11c. TA reflective film 13 made of aluminum is formed on the sloped surface 11b. The height from a bottom surface to a top surface of the optical member 5A is 500 μm. The height of the sloped surface 11b is 200 μm.

The second main surface 11c of the optical member 5A is fixed to the mounting board 1 via the metal layer 2B. A distance between the optical member 5A and the submount 3 (described below) is, for example, 35 μm on the front surface of the mounting board 1.

The submount 3 is made of AlN, and on the rear surface of the submount, titanium (having thickness of 0.06 μm) and platinum (having thickness of 0.2 μm) are layered. The submount 3 has a rectangular-parallelepiped shape of 450× 1900×200 (thickness) μm.

At the time of mounting the submount 3 on the mounting board 1, titanium (having thickness of 0.06 μm) and platinum (having thickness of 0.2 μm), Au-Sn-based eutectic solder (having thickness of 3 μm), and then platinum (0.2 μm) and titanium (0.06 μm) are layered in that order from a mounting board 1 side, and heating is performed.

The semiconductor laser element 4 is disposed on the submount 3 via an Au-Sn-based eutectic solder, for example. The semiconductor laser element 4 is a substantially rectangular element (150×1200 μm) formed of a nitride semiconductor and having an oscillation wavelength of 445 nm.

An end surface of the semiconductor laser element 4 on the optical member 5A side is disposed so as to protrude from an end surface of the submount 3 toward the optical member 5A. The distance between these end surfaces is 15 μm, for example.

The light emission surface of the semiconductor laser element 4 faces the reflecting surface of the optical member 5A, and is disposed about 100 μm away from the optical member 5A.

The cap 8 is fixed on the mounting board 1 so that the semiconductor laser element 4 and the optical member 5A is sealed airtight. The cap 8 has an opening in its top surface, and a light-transmissive member 7 made of glass is provided to the opening.

In this semiconductor laser device 10, a reflecting surface with good smoothness whose angular precision is easily achieved can be utilized, and a reflective film of good film quality is disposed on this reflecting surface, which allows for obtaining a semiconductor laser device with good reflection efficiency and durability at a low cost.

Also, in this structure, most portion of the semiconductor laser element 4 can be arranged on the submount 3, so that good heat dissipation by the submount 3 can be ensured. Furthermore, in this structure, the semiconductor laser element 4 and the optical member 5A can be arranged close to each other, a laser beam diameter of laser light can be maintained to be small, so that light of high luminance can be obtained.

EXAMPLE 4

Semiconductor Laser Device

As shown in FIG. 5, a semiconductor laser device 20 in this Example is configured substantially the same as the semiconductor laser device 10, except that the semiconductor laser device 20 includes an optical member 5 and two semiconductor laser elements 4 interposing the optical member 5. A cap 28 includes a light-transmissive member 27 in an opening 8a of a metal member, and laser light can be extracted from the light-transmissive member 27.

For the optical member 5 in Example 4, the optical member illustrated in FIG. 2D in the manufacture of the above-mentioned optical member can be used. The optical member 5 has a shape such that a tetragonal truncated pyramid is arranged on a rectangular parallelepiped shape, and has substantially tetragonal top and bottom surfaces of mutually different sizes. Further, between the top surface and the bottom surface, the optical member 5 has two sloped surfaces 11b inclined at 45 degrees to the top surface and two non-sloped surfaces adjacent to the top surface. The optical member 5 has a height of 500 μm from the bottom surface to the top surface. The height of the sloped surface 11b is 200 μm.

The two semiconductor laser elements 4 are disposed facing the two reflecting surfaces of the optical member 5.

EXAMPLE 5

Semiconductor Laser Device

As shown in FIG. 6, a semiconductor laser device 30 in this Example has substantially the same configuration as the semiconductor laser device 10, except that the orientation of the optical member 15 disposed on the mounting board 1 is different. A cap 38 includes a light-transmissive member 37 provided to an opening in a metal member, and laser light can be extracted through the light-transmissive member 37.

For the optical member 15 in Example 5, the optical member illustrated in FIG. 3B in the method for manufacturing the above-described optical member can be used. The reflecting surface of the optical member 15 is the {110} plane of the silicon substrate, which is the second main surface 11c, and a reflective film 23 made of a layered film of an SiO$_2$ film (having thickness of 75 nm) and a ZrO$_2$ film (having thickness of 50 nm) is arranged on reflecting surface. The {100} plane of the optical member 15, which is the sloped surface 11b, is fixed to the mounting board 1 via a metal layer 2B so that the reflecting surface has an angle of 45 degrees with respect to the mounting board 1 surface.

The optical member 15 has a height of 1000 μm from the lowermost end to the uppermost end thereof.

EXAMPLE 6

Semiconductor Laser Device

Figure 7:
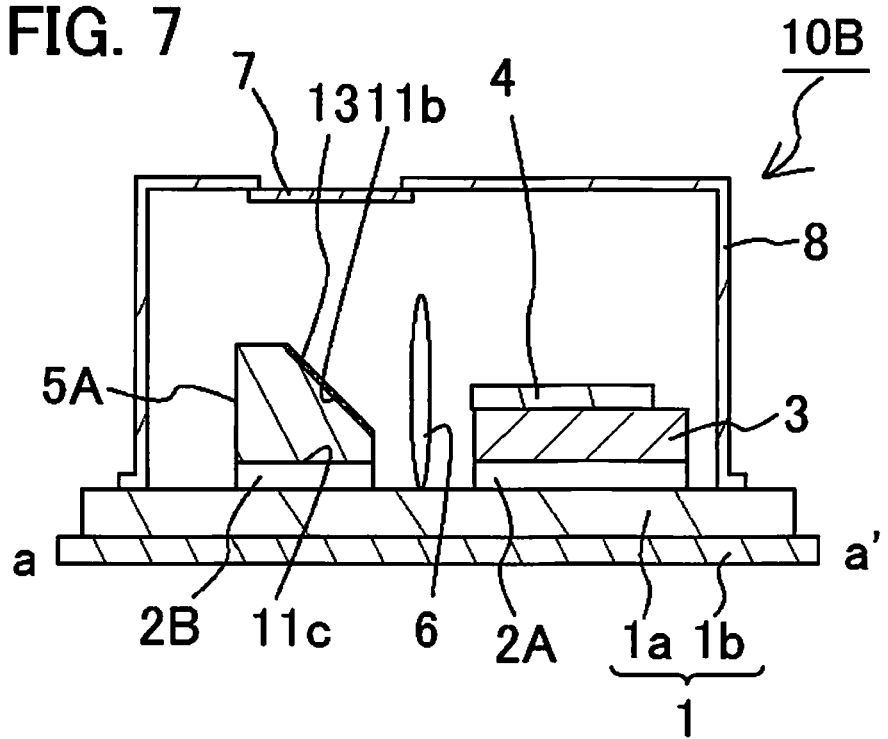
FIG. 7 is schematic cross-sectional view of another embodiment of the semiconductor laser device of the present disclosure.

As shown in FIG. 7, a semiconductor laser device 10B in this Example is configured substantially the same as the semiconductor laser device 10, except that a lens 6 is disposed between an optical member 5A and a semiconductor laser element 4. The lens 6 has a function of a collimating lens for converting the light emitted from the semiconductor laser element 4 into coherent light.

According to the manufacturing method of the present disclosure, an optical member having an inclined reflecting surface that is inexpensive and has high-quality can be easily provided for a wide range of surface-mount laser packages of various sizes and shapes such as a high power semiconductor laser package and low-cost compact laser package, which demand has been increased in recent years. Further, the semiconductor laser device of the present disclosure can be widely used in devices such as optical disks, optical communication systems, projectors, display, printers or meters.

What is claimed is:

1. A method for manufacturing an optical member adapted to be irradiated by laser light, the method comprising:
   providing a silicon substrate having a first main surface of a {110} plane;
   forming a mask pattern having an opening extending in a <100> direction on the first main surface of the silicon substrate;
   forming a sloped surface of {100} plane in the silicon substrate by wet-etching the silicon substrate from a first main surface side using the mask pattern as a mask; and
   forming a reflective film on a second main surface of the silicon substrate, which is parallel to the first main surface, the reflective film being configured to reflect substantially all the laser light irradiated thereon.

2. The method for manufacturing an optical member according to claim 1, wherein
   the forming of the reflective film on the second main surface of the silicon substrate is performed after the forming of the sloped surface.

3. The method for manufacturing an optical member according to claim 1, further comprising
   dividing the silicon substrate from a lower end of the sloped surface in the <100> direction, after the forming of the sloped surface.

4. The method for manufacturing an optical member according to claim 3, wherein
   the forming of the mask pattern includes forming the mask pattern having an opening extending in a <110> direction in addition to the opening extending in the <100> direction.

5. The method for manufacturing an optical member according to claim 4, further comprising
   dividing the silicon substrate in the <110> direction, after the forming of the sloped surface.

6. A method for manufacturing a semiconductor laser device, comprising:
   manufacturing an optical member by the method according to claim 1; and
   fixing the optical member and a semiconductor laser element on a mounting board so that laser light emitted from the semiconductor laser element is irradiated to the reflective film of the optical member.

7. The method for manufacturing a semiconductor laser device according to claim 6, wherein
   the fixing of the optical member includes fixing the optical member on the mounting board so that an angle defined by a main surface of the mounting board and a surface of the optical member on which the reflective film is formed is 45 degrees.

8. The method for manufacturing a semiconductor laser device according to claim 6, wherein
   the fixing of the semiconductor laser element includes fixing the semiconductor element on the mounting board via a submount.

9. The method for manufacturing a semiconductor laser device according to claim 8, wherein
   the fixing of the semiconductor laser element includes arranging the semiconductor laser element so that a portion of the semiconductor laser element protrudes from an end of the submount toward the optical member.

10. The method for manufacturing a semiconductor laser device according to claim 6, further comprising
    arranging a cap on the mounting board so as to hermetically seal the semiconductor laser element and the optical member.

11. The method for manufacturing a semiconductor laser device according to claim 8, wherein
    the semiconductor laser clement is junction-down mounted on the submount.

12. The method for manufacturing an optical member according to claim 1, wherein
    the forming of the sloped surface includes forming a pair of sloped surfaces facing each other to define a groove having a substantially V-shape in cross section.

13. The method for manufacturing, an optical member according to claim 12, wherein
    the forming of the pair of sloped surfaces includes forming each of the sloped surfaces to form an angle of 135 degrees with respect to the first main surface of the silicon substrate.

14. The method for manufacturing an optical member according to claim 3, wherein
    the forming of the sloped surfaces includes forming a plurality of pairs of sloped surfaces facing each other so that each of the pair of sloped surfaces defines a groove having a substantially V-shape in cross section,
    the dividing of the silicon substrate includes dividing the silicon substrate from the lower end of the groove defined by each of the pairs of sloped surfaces so that the sloped surfaces are respectively arranged on both sides of the optical member after the dividing.

15. The method for manufacturing an optical member according to claim 1, wherein
the forming of the sloped surface includes wet-etching the silicon substrate by using tetramethylammonium hydroxide as an etchant.

* * * * *